US009190189B2

(12) United States Patent
Harada et al.

(10) Patent No.: US 9,190,189 B2
(45) Date of Patent: Nov. 17, 2015

(54) ALUMINUM NITRIDE SUBSTRATE FOR CIRCUIT BOARD AND PRODUCTION METHOD THEREOF

(75) Inventors: Yusaku Harada, Omuta (JP); Katsunori Terano, Omuta (JP); Takeshi Gotoh, Omuta (JP)

(73) Assignee: DENKI KAGAKU KOGYO KABUSHIKI KAISHA, Tokyo (JP)

( * ) Notice: Subject to any disclaimer, the term of this patent is extended or adjusted under 35 U.S.C. 154(b) by 171 days.

(21) Appl. No.: 13/702,523

(22) PCT Filed: May 24, 2011

(86) PCT No.: PCT/JP2011/061823
§ 371 (c)(1),
(2), (4) Date: Feb. 18, 2013

(87) PCT Pub. No.: WO2011/155319
PCT Pub. Date: Dec. 15, 2011

(65) Prior Publication Data
US 2013/0149530 A1    Jun. 13, 2013

(30) Foreign Application Priority Data
Jun. 8, 2010 (JP) ................................. 2010-130665

(51) Int. Cl.
*B32B 9/00* (2006.01)
*H01B 3/02* (2006.01)
(Continued)

(52) U.S. Cl.
CPC .............. *H01B 3/025* (2013.01); *C04B 35/581* (2013.01); *C04B 35/645* (2013.01); *C04B 35/6455* (2013.01); *H01B 19/00* (2013.01); *H01L 23/15* (2013.01); *H05K 1/0306* (2013.01); *C04B 2235/3205* (2013.01);
(Continued)

(58) Field of Classification Search
None
See application file for complete search history.

(56) References Cited

U.S. PATENT DOCUMENTS 5,328,876 A * 7/1994 Nishioka et al. ............. 501/98.4
5,393,715 A    2/1995 Nakahata et al.
(Continued)

FOREIGN PATENT DOCUMENTS

EP    0 882 689 A2   12/1998
EP    1 420 004 A2    5/2004
(Continued)

OTHER PUBLICATIONS

Extended European Search Report issued in Application No. 11 79 2276 dated Jan. 23, 2014.
(Continued)

*Primary Examiner* — Mark Ruthkosky
*Assistant Examiner* — Daniel J Schleis
(74) *Attorney, Agent, or Firm* — Pearne & Gordon LLP

(57) ABSTRACT

Disclosed is an aluminum nitride substrate for a circuit board, the substrate having aluminum nitride crystal grains with an average grain size of 2 to 5 μm and a thermal conductivity of at least 170 W/m·K. The aluminum nitride substrate does not include a dendritic grain boundary phase and has a breakdown voltage of at least 30 kV/mm at 400° C. Also provided is a method for producing the aluminum nitride substrate, including the steps of heating a raw material containing an aluminum nitride powder to 1500° C. at a pressure of at most 150 Pa, then increasing and holding the temperature at 1700 to 1900° C. in a pressurized atmosphere of at least 0.4 MPa using a non-oxidizing gas, then cooling to 1600° C. at a cooling rate of at most 10° C./min.

3 Claims, 2 Drawing Sheets

(51) Int. Cl.
*C04B 35/581* (2006.01)
*C04B 35/645* (2006.01)
*H01L 23/15* (2006.01)
*H01B 19/00* (2006.01)
*H05K 1/03* (2006.01)

(52) U.S. Cl.
CPC .......... *C04B 2235/3217* (2013.01); *C04B 2235/3222* (2013.01); *C04B 2235/3225* (2013.01); *C04B 2235/386* (2013.01); *C04B 2235/5436* (2013.01); *C04B 2235/5445* (2013.01); *C04B 2235/658* (2013.01); *C04B 2235/6565* (2013.01); *C04B 2235/661* (2013.01); *C04B 2235/786* (2013.01); *C04B 2235/85* (2013.01); *C04B 2235/87* (2013.01); *C04B 2235/9607* (2013.01); *Y10T 428/268* (2015.01)

(56) References Cited

U.S. PATENT DOCUMENTS

| | | | | |
|---|---|---|---|---|
| 5,409,868 A | * | 4/1995 | Dasgupta et al. | 501/96.3 |
| 5,482,905 A | * | 1/1996 | Nakahata et al. | 501/98.4 |
| 5,760,532 A | * | 6/1998 | Makoto et al. | 313/130 |
| 5,993,699 A | * | 11/1999 | Katsuda et al. | 252/521.5 |
| 6,017,485 A | * | 1/2000 | Enck et al. | 264/618 |
| 8,791,566 B2 | * | 7/2014 | Yamaguchi et al. | 257/734 |

FOREIGN PATENT DOCUMENTS

| | | | |
|---|---|---|---|
| JP | 03-197368 A | | 8/1991 |
| JP | 06-128041 A | | 5/1994 |
| JP | 07-097265 A | | 4/1995 |
| JP | 2003-070169 A | | 3/2003 |
| JP | 2003-073169 A | | 3/2003 |
| JP | 2004-214690 A | | 7/2004 |
| JP | 2006-013257 A | | 1/2006 |
| WO | WO2010109960 | * | 9/2010 |

OTHER PUBLICATIONS

International Search Report for PCT/JP2011/061823 dated Aug. 30, 2011.

* cited by examiner

ALUMINUM NITRIDE SUBSTRATE FOR CIRCUIT BOARD AND PRODUCTION METHOD THEREOF

TECHNICAL FIELD

The present invention relates to an aluminum nitride substrate with excellent insulation properties at a high temperature, and a production method thereof.

BACKGROUND ART

With the growth of electronics technologies, and amidst the progressively increasing power output of semiconductors, aluminum nitride substrates with excellent insulation properties used in circuit boards for semiconductor mounting are being used in various fields, e.g., as substrate materials used in the drive control of trains or electric automobiles or in the control of industrial robots. Among them, highly reliable SiC chips are promising materials for replacing current Si chips in order to develop the next generation of semiconductors with the characteristics of reduced switching loss or energy loss which greatly affects product reliability and expanded control operation temperature. The operable temperature of a SiC chip is around 400° C., which is higher than the conventional 150° C., so the aluminum nitride substrate used as an insulating material of a circuit board for semiconductor mounting also needs to exhibit excellent insulation properties at such high temperatures.

Conventionally, the aluminum nitride sintered bodies used as the above aluminum nitride substrates have generally been produced by the following method. Specifically, additives such as sintering aids, binders, plasticizers, dispersion media or mold release agents are mixed with an aluminum nitride powder. The mixture is formed into a sheet by extrusion molding etc., and processed (formed/pressed) into a desired shape and dimensions by a pressing machine. Next, the compact is heated to 350 to 700° C. in air or in a non-oxidizing atmosphere such as nitrogen to remove the binder (debindering), and then held for 0.5 to 10 hours at 1800 to 1900° C. in a non-oxidizing atmosphere such as nitrogen (sintering) to produce a sintered body.

However, while the breakdown voltage of an aluminum nitride substrate produced by this method is approximately 30 to 40 kV/mm at room temperature, thus exhibiting high insulation properties, there was the problem of it decreasing to approximately 10 kV/mm at high temperatures such as 400° C.

Various proposals have been heretofore made in order to increase the insulation properties of an aluminum nitride sintered body. For, example, a method for increasing unpaired electron concentration by forming a solid solution of titanium in aluminum nitride crystal grains (Patent Document 1) and a method for controlling the average diameter of aluminum nitride crystal grains or grain boundary pores and the ratio between grain boundary pores and intragranular pores (Patent Document 2) have been proposed. However, nothing until now has been able to ensure insulation properties at a high temperature.

RELATED ART DOCUMENTS

Patent Documents

Patent Document 1: JP-A H06-128041
Patent Document 2: JP-A 2006-13257

SUMMARY OF THE INVENTION

The object of the present invention is to provide an aluminum nitride substrate having excellent insulation properties at high temperatures, and a production method thereof.

An aspect of the present invention provides an aluminum nitride substrate for a circuit board, having aluminum nitride crystal grains with an average grain size of 2 to 5 μm and a thermal conductivity of at least 170 W/m·K, wherein the aluminum nitride substrate for a circuit board does not comprise a dendritic grain boundary phase and has a breakdown voltage of at least 30 kV/mm at 400° C.

The grain boundary phase above in one aspect is a discontinuously dispersed non-dendritic grain boundary phase. In another aspect, the cumulative 10% grain size d10 is at least 0.6 μm, and the cumulative 50% grain size d50 is at most 1.6 μm in the number-grain size distribution of the grain boundary phase as measured from a mirror-polished surface of the aluminum nitride substrate.

An additional aspect of the present invention provides a method for producing an aluminum nitride substrate for a circuit board with a breakdown voltage of at least 30 kV/mm at 400° C., comprising the steps of:
heating a raw material comprising an aluminum nitride powder to 1500° C. at a pressure of at most 150 Pa;
then increasing and holding the temperature at 1700 to 1900° C. in a pressurized atmosphere of at least 0.4 MPa using a non-oxidizing gas;
then cooling to 1600° C. at a cooling rate of at most 10° C./min.

While the aluminum nitride powder is not particularly limited, in one embodiment, it may be a powder with, as impurities, an oxygen content of at most 1.2 mass %, a carbon content of at most 0.04 mass %, a Fe content of at most 30 ppm and a Si content of at most 60 ppm. Moreover, the raw material usually includes a sintering aid, and as the sintering aid in one embodiment, a rare-earth metal compound, an alkaline-earth metal compound or a transition metal compound is used.

A further aspect of the present invention provides an aluminum nitride substrate for a circuit board produced by the above production method, i.e., an aluminum nitride substrate produced by heating a raw material comprising an aluminum nitride powder to 1500° C. at a pressure of at most 150 Pa, then increasing and holding the temperature at 1700 to 1900° C. in a non-oxidizing pressurized atmosphere of at least 0.4 MPa, then cooling to 1600° C. at a cooling rate of at most 10° C./min.

According to the present invention, an aluminum nitride substrate which has excellent insulation properties at a high temperature and is suitable for use in a circuit board, and a production method thereof are provided.

MODES FOR CARRYING OUT THE INVENTION

One embodiment of the aluminum nitride substrate for a circuit board according to the present invention shall be explained.

The aluminum nitride substrate for a circuit board according to the present invention comprises aluminum nitride crystal grains and a grain boundary phase filling the space between the grains, and is an aluminum nitride substrate characterized by having a thermal conductivity of at least 170 W/m·K and a breakdown voltage of at least 30 kV/mm at 400° C. The breakdown voltage has the meaning usually understood by those skilled in the art, and can be obtained by applying a voltage to a sample and dividing the voltage at which breakdown occurs by the thickness of the sample in accordance with JIS C2110.

The average grain size of the aluminum nitride crystal grains is preferably 2 to 5 µm. The average grain size of the aluminum nitride crystal grains can be obtained by measuring the grain sizes observed on a fracture surface of the aluminum nitride substrate using a scanning electron microscope and calculating the average of the sizes as measured. When the average grain size of the aluminum nitride crystal grains is less than 2 µm, refinement of the aluminum nitride substrate becomes insufficient, and thermal conductivity may decrease. On the other hand, when the average grain size of the aluminum nitride crystal grains exceeds 5 µm, the voids between the aluminum nitride crystal grains become large, and since the voids cannot be sufficiently filled by the grain boundary phase, insulation properties and mechanical strength may decrease. Additionally, intragranular fracture of the aluminum nitride crystal grains may occur when stress is applied, which is associated with a decrease in mechanical strength.

Figure 1:
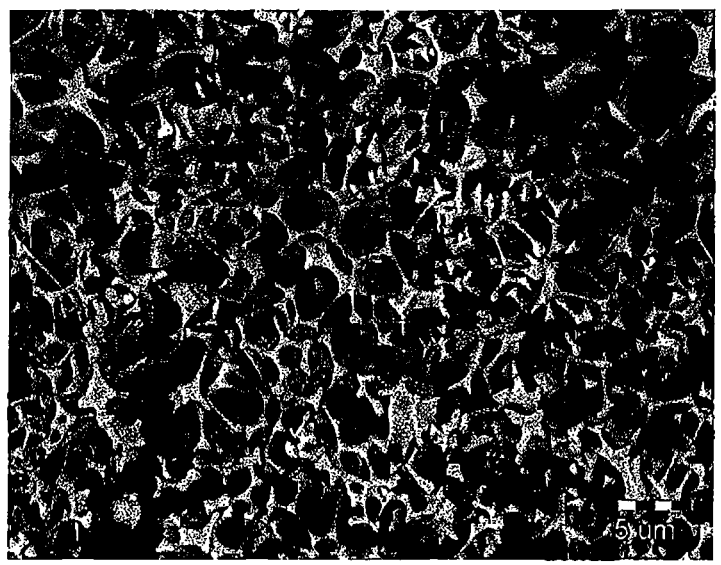
[FIG. 1] is a scanning electron microscope picture showing an example of a dendritic grain boundary phase of a conventional aluminum nitride substrate.
Figure 2:
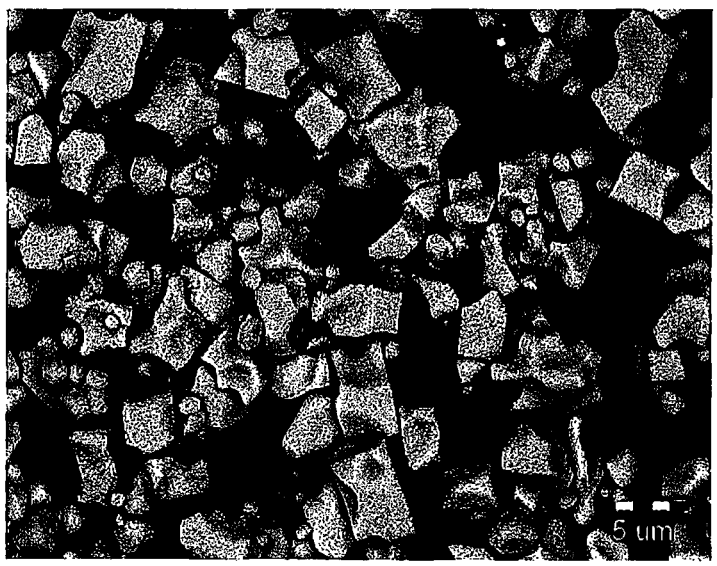
[FIG. 2] is a scanning electron microscope picture showing an example of a non-dendritic grain boundary phase of an aluminum nitride substrate according to the present invention.

The aluminum nitride substrate of the present invention is an aluminum nitride substrate characterized by not comprising a dendritic grain boundary phase. In other words, the grain boundary phase is characterized by being a non-dendritic grain boundary phase. That is, as a result of diligent studies in order to improve the insulation properties at a high temperature, the present inventors discovered that a grain boundary phase in dendritic shape is often observed in aluminum nitride substrates with a breakdown voltage of less than 30 kV/mm at 400° C., whereas the dendritic grain boundary phase is never observed in aluminum nitride substrates with a breakdown voltage exceeding 30 kV/mm, and their grain boundary phase is a non-dendritic grain boundary phase wherein numerous grain boundary phases are discontinuously dispersed. The shape of a grain boundary phase can be verified by, for example, placing 1 g of an aluminum nitride substrate in 50 ml of a 20% sodium hydroxide aqueous solution, keeping it at 130° C. for 12 hours, letting it stand until the aluminum nitride crystal grains dissolve, then filtering and washing to remove the remnant grain boundary phase, and observing using a scanning electron microscope. The "dendritic grain boundary phase" herein refers to a grain boundary phase with the shape of multiple grain boundary phases being three-dimensionally linked. As such, the grain boundary phase of the aluminum nitride substrate of the present invention does not comprise such a dendritic grain boundary phase portion, and the grain boundary phase is a non-dendritic grain boundary phase with numerous grain boundary phases being discontinuously dispersed. The microscope picture of FIG. 1 shows an example in which a dendritic grain boundary phase as above is observed, and the microscope picture of FIG. 2 shows an example in which a dendritic grain boundary phase is not included and a non-dendritic grain boundary phase with discontinuously dispersed grain boundary phases is observed.

The dendritic grain boundary phase is suspected to have the two following effects on the insulation properties of an aluminum nitride substrate at a high temperature.

The first is the presence of minute voids caused by the difference in the coefficient of thermal expansion between the aluminum nitride crystal grains and the grain boundary phase constituting the aluminum nitride substrate. Since the coefficient of thermal expansion of the grain boundary phase at 25 to 400° C. is close to about twice that of aluminum nitride, when the temperature is high, the interface between the aluminum nitride crystal grains and the grain boundary phase is believed to have minute distortions or voids caused by the difference in their expansion. In this case, if a three-dimensionally expanding dendritic grain boundary phase is present, the minute voids can be expected to be continuously distributed throughout the aluminum nitride substrate, and the insulation distance will be reduced, leading to a reduction in the insulation properties of the aluminum nitride substrate. On the other hand, if the grain boundary phase does not include a dendritic grain boundary phase and consists of non-dendritic, discontinuously dispersed phases, the linkage of the minute voids is not expected to occur, so the insulation properties of the aluminum nitride substrate will not be reduced at a high temperature.

The second is the formation of a conductive path of the grain boundary phase. In general, the sintering aid used in sintering is often an alkaline-earth metal compound or a rare-earth metal compound or the like. However, these sintering aids react with oxides present on the surface of the aluminum nitride powder in an early stage of sintering and form a liquid phase of complex oxides. The liquid phase forms a solid solution of impurities in the aluminum nitride crystal grains during the sintering process. As a result thereof, grain growth of the purified aluminum nitride crystal grains occurs, and the structure of the sintered body is refined, resulting in an aluminum nitride substrate with high thermal conductivity and strength. The liquid phase containing a large amount of impurities, when cooled after sintering finishes, will precipitate as a grain boundary phase. For that reason, the electrical insulation ability of the grain boundary phase itself can be expected to be lower than that of the aluminum nitride crystal grains. In particular, in the presence of a three-dimensionally linked dendritic grain boundary phase, it is surmised that the grain boundary phase with low insulation will act as a conductive path, and the insulation properties of the aluminum nitride substrate will decrease.

Further, in one embodiment of the present invention, the aluminum nitride substrate has a cumulative 10% grain size d10 of at least 0.6 µm and a cumulative 50% grain size d50 of at most 1.6 µm in the number-grain size distribution of the grain boundary phase as measured from a mirror-polished surface. The method for measuring the number-grain size distribution of a grain boundary phase is explained below. That is, after embedding an aluminum nitride substrate in an epoxy resin and solidifying it, it is cut perpendicularly to the direction of the thickness of the substrate, and the cross section is mirror polished by buffing. By observing the polished surface under a scanning electron microscope and measuring the grain sizes of the grain boundary phase from the image using image analysis software, a number-grain size distribution can be obtained. When the cumulative 10% grain size d10 is less than 0.6 µm, a part of the grain boundary phase in the aluminum nitride substrate may exist in dendritic form, and when the cumulative 50% grain size d50 exceeds 1.6 µm, grain boundary phases may be linked as a lump-shaped aggregate. In either case, the insulation properties of the aluminum nitride substrate may be reduced at a high temperature due to the above-mentioned effects of the grain boundary phase. While aluminum nitride substrates focusing on the grain size of the aluminum nitride crystal grains or the composition of the grain boundary phase have been conventionally known, there has been no disclosure of the importance of the shape or distribution state of the grain boundary phase to insulation properties, or further, the relationship between insulation properties and the number-grain size distribution of a grain boundary phase as measured from a mirror-polished surface. In particular, the improvement of the insulation properties of an aluminum nitride substrate at a high temperature by not including a dendritic grain boundary phase was not known until now.

As described above, the aluminum nitride substrate according to the present invention does not contain a dendritic grain boundary phase, and therefore-has excellent insulation properties at a high temperature. So long as a non-dendritic grain boundary phase can be formed, the substrate may be produced by any method. Nonetheless, as a result of diligent research, the present inventors discovered that by simply using specific conditions for conditions such as the pressure in the furnace during sintering and cooling rate, it is possible to ensure the formation of a non-dendritic grain boundary phase and to produce an aluminum nitride substrate with a breakdown voltage of at least 30 kV/mm at 400° C.

That is, the method for producing an aluminum nitride substrate according to the present invention comprises:

(i) a raw material preparation step for preparing a raw material comprising an aluminum nitride powder; and (ii) a sintering step for heating the raw material to 1500° C. at a pressure of 150 Pa, then increasing and holding the temperature at 1700 to 1900° C. in a pressurized atmosphere of at least 0.4 MPa using a non-oxidizing gas, then cooling to 1600° C. at a cooling rate of at most 10° C./min.

(i) Raw Material Preparation Step:

In addition to the aluminum nitride powder, additives such as sintering aids, binders, plasticizers, dispersion media or mold release agents may be used as appropriate. The aluminum nitride powder is not particularly limited, and it is possible to use aluminum nitride powders produced by a known method such as a direct nitridation method for nitriding a metal aluminum in a nitrogen atmosphere or a reduction nitridation method for reducing alumina with carbon. However, among them, those that are fine powders with a high purity are preferred. Specifically, those with, as impurities, an oxygen content of at most 1.2 mass %, a carbon content of at most 0.04 mass %, a Fe content of at most 30 ppm and a Si content of at most 60 ppm, are preferably used, and those with a maximum grain size of at most 20 μm are more preferred. While oxygen is basically an impurity, it has the effect of preventing over-sintering. Therefore, in order to prevent the strength of a sintered body from decreasing due to over-sintering, those with an oxygen content of at least 0.7 mass % are preferably used.

The sintering aid is not particularly limited, and a rare-earth metal compound, an alkaline-earth metal compound or a transition metal compound etc. may be used. Among them, yttrium oxide or a combination of yttrium oxide and aluminum oxide is preferred. These sintering aids react with the aluminum nitride powder and form a liquid phase of complex oxides (e.g, $2Y_2O_3 \cdot Al_2O_3$, $Y_2O_3 \cdot Al_2O_3$, $3Y_2O_3 \cdot 5Al_2O_3$), the liquid phase leads to high refinement of the sintered body, and the simultaneous extraction of the impurities in the aluminum nitride grains such as oxygen, and the segregation as an oxide phase of the crystal grain boundary lead to a high thermal conductivity.

In the raw material preparation step (i), the above aluminum nitride powder and a sintering aid are mixed by a mixing device, and a binder etc. are added to the mixed raw material powder, which is then formed by sheet forming etc. to obtain a compact. This is further debindered to obtain a debindered body as a raw material for sintering. The method for mixing the aluminum nitride powder etc. is not particularly limited, and for example, a known mixing device such as a ball mill, a rod mill or a mixer may be used. While the binder is not particularly limited, it is preferable to use a methyl cellulose binder having plasticity or a surfactant effect or an acrylic acid ester binder with excellent thermal degradability. Additionally, a plasticizer or a dispersion medium etc. may be used in combination as necessary. In one example, the plasticizer is glycerine etc., and the dispersion medium is ion-exchanged water or ethanol etc.

While the method for debindering the formed sheet is not particularly limited, the binder is preferably removed by heating the formed sheet to 300 to 700° C. in air or a non-oxidizing atmosphere such as nitrogen. The debindering time needs to be appropriately determined according to the size of the formed sheet and the number of the sheets to be processed, but it is usually 1 to 10 hours.

(ii) Sintering Step:

The raw material (debindered body) obtained at the raw material preparation step (i) is sintered to obtain an aluminum nitride sintered body. In this step, first, the pressure in the sintering furnace is made at most 150 Pa, and the temperature is increased to 1500° C. By doing so, the residual carbon in the debindered body is removed, and an aluminum nitride sintered body with a preferred sintered body structure and thermal conductivity is obtained. When the pressure in the furnace exceeds 150 Pa, carbon removal will be insufficient, and when heated above 1500° C., refinement of the aluminum nitride crystal grains progresses in one part, closing off the carbon diffusion path, so carbon removal will be insufficient.

Next, the temperature is increased to 1700 to 1900° C. in a non-oxidizing and pressurized atmosphere of at least 0.4 MPa, and held. By doing so, an aluminum nitride sintered body with a high thermal conductivity and improved insulation properties is obtained. Sintering in a pressurized atmosphere with the pressure in the furnace being at least 0.4 MPa is considered to make vaporization of the sintering aid in a liquid phase difficult, to enable effective suppression of the occurrence of voids between the aluminum nitride crystal grains and to enable improvement of the insulation properties of the aluminum nitride substrate. Additionally, when the sintering temperature is less than 1700° C., grain growth of the aluminum nitride crystal grains does not sufficiently progress, so a dense sintered body structure is not obtained and the thermal conductivity of the aluminum nitride substrate may decrease. On the other hand, when the sintering temperature exceeds 1900° C., grain growth of the aluminum nitride crystal grains progresses excessively, the voids between the aluminum nitride crystal grains become greater, and the insulation properties may decrease.

Here, "non-oxidizing atmosphere" refers to an inactive gas atmosphere or a reducing atmosphere etc. not containing an oxidizing gas such as oxygen.

Next, the temperature is cooled to 1600° C. at a cooling rate of at most 10° C./min in a pressurized atmosphere. It is believed that in early stages of cooling, the crystal grain boundary has a liquid phase, which solidifies around 1600° C. The cooling rate when cooling the furnace in conventional production is at least 15° C./min. When the cooling rate is that high, the solidification of the liquid phase progresses rapidly, resulting in the precipitation of a dendritic grain boundary phase at a two-grain interface of the aluminum nitride crystal grains. However, when cooling at a cooling rate of at most 10° C./min, the grain boundary phase precipitates in a manner filling the voids existing between the aluminum nitride crystal grains, so linkage of grain boundary phases does not occur, and the precipitation of a dendritic grain boundary phase can be suppressed. Moreover, since the grain boundary phase precipitates while alleviating the distortion between the aluminum nitride crystal grains, it is considered that the occurrence of minute cracks at a high temperature is suppressed in the resulting aluminum nitride substrate, and the insulation properties are improved. After the slow cooling to 1600° C. finishes, rapid cooling to room temperature can be carried out in the conventional manner.

Additionally, the pressure inside the furnace is preferably at least 0.4 MPa. When it is less than 0.4 MPa, the sintering aid in a liquid phase vaporizes before precipitating as a grain boundary phase, and voids occurs between aluminum nitride crystal grains, so the insulation properties of the aluminum nitride substrate are reduced. Moreover, the cooling method can be carried out by controlling the heater temperature of the sintering furnace.

The present invention shall be explained in more detail with reference to examples below, but the scope of the present invention is not limited by the examples.

EXAMPLES

Example 1

3 parts by mass of an yttrium oxide powder was added to 97 parts by mass of an aluminum nitride powder, and mixed for 1 hour in a ball mill to obtain a mixed powder. 6 parts by mass of a cellulose ether binder, 5 parts by mass of glycerine and 10 parts by mass of ion-exchanged water were added to 100 parts by mass of the mixed powder, and mixed for 1 minute in a Henschel mixer to obtain a mixture. Next, the mixture was formed into a 0.8 mm-thick sheet in a single screw extruder, and punched into dimensions of 90 mm×90 mm using a press machine with a die. After applying a boron nitride powder as a mold release agent to the formed sheet, 15 sheets were stacked, heated and debindered at 570° C. for 5 hours in air. Next, the debindered bodies were transferred to a vacuum/pressure furnace and heated to 1500° C. at a pressure of 100 Pa in the furnace. Nitrogen was then introduced to achieve a pressurized atmosphere of 0.6 MPa in the furnace, the temperature was raised to 1750° C., held for 2 hours, and then cooled to 1600° C. at a cooling rate of 1° C./min to obtain aluminum nitride substrates. The resulting aluminum nitride substrates were evaluated for average grain size of the aluminum nitride crystal grains, presence or absence of a dendritic grain boundary phase, number-grain size distribution in the grain boundary phase, thermal conductivity, and breakdown voltages at 25° C. and 400° C. The results are shown in Table 1

<Materials Used>

Aluminum nitride powder: average grain size 1.2 µm, oxygen content 0.8 mass %

Yttrium oxide powder: manufactured by Shin-Etsu Chemical Co., Ltd., product name "Yttrium Oxide"

Binder: manufactured by Shin-Etsu Chemical Co., Ltd., product name "Metolose"

Glycerine: manufactured by Kao Corporation, product name "Exeparl"

Boron nitride powder: manufactured by Denki Kagaku Kogyo Kabushiki Kaisha, product name "Denka Boron Nitride MGP"

<Evaluation Methods>

Average grain size of aluminum nitride crystal grains: A fractured surface of the aluminum nitride substrate was magnified 2000 times using a scanning electron microscope, the grain sizes of 50 aluminum nitride crystal grains were measured, and an average value was calculated.

Presence or absence of dendritic grain boundary phase: 1 g of the aluminum nitride substrate was placed in 50 ml of a 20% sodium hydroxide aqueous solution, kept at 130° C. for 12 hours, left standing until the aluminum nitride crystal grains dissolve, and then filtered and washed to remove the residual grain boundary phase, which was verified by observing under a scanning electron microscope.

Figure 3:
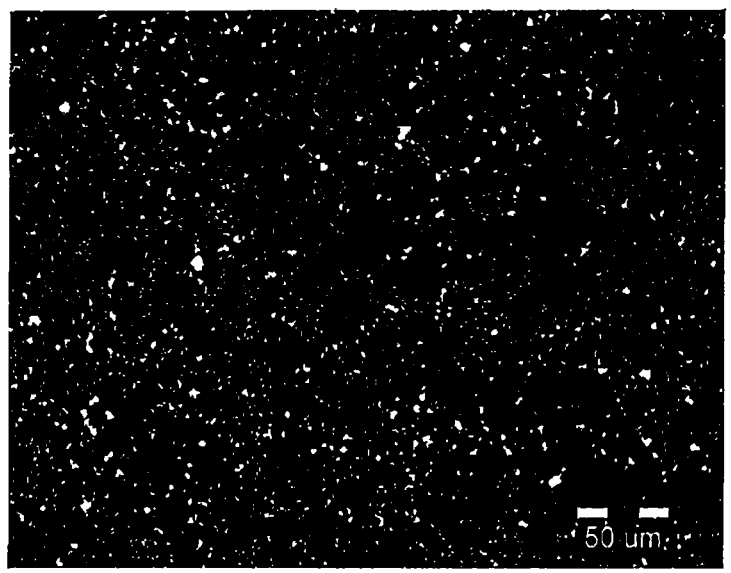
[FIG. 3] is a scanning electron microscope picture showing an example of a mirror-polished surface of an aluminum nitride substrate according to the present invention.

Number-grain size distribution of grain boundary phase: a fractured surface of the aluminum nitride substrate was polished using "Automatic Grinder-Polisher EcoMet 3" manufactured by Buehler, the polished surface was magnified 500 times using a scanning electron microscope, and the distribution state of the grain boundary phases were observed (area of observation: 155 µm×231 µm). FIG. 3 shows an example of a mirror polished surface of the aluminum nitride substrate observed under the scanning electron microscope. The obtained image was image analyzed using "Image-Pro Plus 6.2J" manufactured by Media Cybernetics, Inc., and cumulative 10% grain size d10 and cumulative 50% grain size d50 were calculated.

Thermal conductivity: Thermal conductivity was measured using "Laser Flash Thermal Constants Analyzer TC-7000" manufactured by ULVAC Technologies, Inc.

Breakdown voltages at 25° C. and 400° C.: They can be measured by providing electrodes inside a furnace capable of heating to 400° C., and by providing in combination an AC voltage resistance measuring device. In order to eliminate atmospheric effects during the measurement, the measurement was carried out using a 0.3 MPa nitrogen atmosphere as the atmosphere inside the furnace. Spherical electrodes were placed on the upper and lower surfaces of the aluminum nitride substrate in the furnace kept at a predetermined temperature, voltage was applied to the sample in accordance with JIS C2110, and the voltage when breakdown occurred was measured. The voltage when breakdown occurred was divided by the thickness of the sample to calculate the breakdown voltage.

Examples 2 and 3

Other than changing the sintering atmosphere until 1500° C. as shown in Table 1, aluminum nitride substrates were obtained in a manner similar to that of Example 1. The results are shown in Table 1.

Examples 4 and 5

Other than changing the sintering atmosphere from 1500° C. to the sintering temperature as shown in Table 1, aluminum nitride substrates were obtained in a manner similar to that of Example 1. The results are shown in Table 1.

Examples 6 and 7

Other than changing the sintering temperature as shown in Table 1, aluminum nitride substrates were obtained in a manner similar to that of Example 1. The results are shown in Table 1.

Examples 8 and 9

Other than changing the cooling rate as shown in Table 1, aluminum nitride substrates were obtained in a manner similar to that of Example 1. The results are shown in Table 1.

Comparative Example 1

Other than changing the sintering atmosphere and the cooling rate as shown in Table 1, aluminum nitride substrates were obtained in a manner similar to that of Example 1. The results are shown in Table 1.

Comparative Example 2

Other than changing the sintering atmosphere until 1500° C. as shown in Table 1, aluminum nitride substrates were obtained in a manner similar to that of Example 1. The results are shown in Table 1.

Comparative Example 3

Other than changing the sintering atmosphere from 1500° C. to the sintering temperature as shown in Table 1, aluminum nitride substrates were obtained in a manner similar to that of Example 1. The results are shown in Table 1.

Comparative Examples 4 and 5

Other than changing the sintering temperature as shown in Table 1, aluminum nitride substrates were obtained in a manner similar to that of Example 1. The results are shown in Table 1.

Comparative Example 6

Other than changing the cooling rate as shown in Table 1, aluminum nitride substrates were obtained in a manner similar to that of Example 1. The results are shown in Table 1.

TABLE 1

| | Sintering atmosphere | | Sintering temperature (° C.) | Cooling rate (° C./min) | Average grain size of aluminum nitride grains (μm) | Presence or absence of dendritic grain boundary phase | Grain size distribution of grain boundary phase | | Thermal conductivity (W/m·K) | Breakdown voltage at 25° C. (kV/mm) | Breakdown voltage at 400° C. (kV/mm) |
|---|---|---|---|---|---|---|---|---|---|---|---|
| | Room temperature to 1500° C. | 1500° C. to sintering temperature | | | | | d10 (μm) | d50 (μm) | | | |
| Example 1 | Vacuum 100 Pa | Nitrogen 0.6 MPa | 1750 | 1 | 2.7 | absent | 0.66 | 1.48 | 178 | 48 | 47 |
| Example 2 | Vacuum 50 Pa | Nitrogen 0.6 MPa | 1750 | 1 | 2.8 | absent | 0.65 | 1.35 | 176 | 47 | 47 |
| Example 3 | Vacuum 150 Pa | Nitrogen 0.6 MPa | 1750 | 1 | 2.7 | absent | 0.68 | 1.63 | 177 | 39 | 33 |
| Example 4 | Vacuum 100 Pa | Nitrogen 0.4 MPa | 1750 | 1 | 2.7 | absent | 0.53 | 1.49 | 175 | 42 | 36 |
| Example 5 | Vacuum 100 Pa | Nitrogen 0.8 MPa | 1750 | 1 | 2.6 | absent | 0.70 | 1.50 | 178 | 46 | 45 |
| Example 6 | Vacuum 100 Pa | Nitrogen 0.6 MPa | 1720 | 1 | 2.4 | absent | 0.66 | 1.51 | 172 | 45 | 43 |
| Example 7 | Vacuum 100 Pa | Nitrogen 0.6 MPa | 1850 | 1 | 4.7 | absent | 0.63 | 1.23 | 185 | 35 | 34 |
| Example 8 | Vacuum 100 Pa | Nitrogen 0.6 MPa | 1750 | 5 | 2.6 | absent | 0.59 | 1.40 | 175 | 42 | 38 |
| Example 9 | Vacuum 100 Pa | Nitrogen 0.6 MPa | 1750 | 10 | 2.6 | absent | 0.51 | 1.27 | 174 | 40 | 35 |
| Comparative Example 1 | Nitrogen 0.1 MPa | Nitrogen 0.1 MPa | 1750 | 15 | 2.6 | present | 0.44 | 0.90 | 172 | 37 | 8 |
| Comparative Example 2 | Nitrogen 0.1 MPa | Nitrogen 0.6 MPa | 1750 | 1 | 2.7 | present | 0.96 | 2.01 | 176 | 38 | 12 |
| Comparative Example 3 | Vacuum 100 Pa | Nitrogen 0.1 MPa | 1750 | 1 | 2.8 | present | 0.47 | 1.32 | 174 | 40 | 15 |
| Comparative Example 4 | Vacuum 100 Pa | Nitrogen 0.6 MPa | 1680 | 1 | 1.8 | present | 0.79 | 1.96 | 162 | 35 | 8 |
| Comparative Example 5 | Vacuum 100 Pa | Nitrogen 0.6 MPa | 1920 | 1 | 6.2 | present | 0.52 | 0.95 | 180 | 45 | 9 |
| Comparative Example 6 | Vacuum 100 Pa | Nitrogen 0.6 MPa | 1750 | 15 | 2.5 | present | 0.46 | 1.21 | 173 | 37 | 11 |

INDUSTRIAL APPLICABILITY

According to the present invention, an aluminum nitride substrate which has excellent insulation properties at a high temperature and is suitable for use in a circuit board, and a production method thereof are provided.

The invention claimed is:

1. An aluminum nitride substrate for a circuit board, having aluminum nitride crystal grains with an average grain size of 2 to 5 μm and a thermal conductivity of at least 170 W/m-K, wherein the aluminum nitride substrate for a circuit board does not comprise a dendritic grain boundary phase and has a breakdown voltage of at least 30 kV/mm at 400° C., and is produced by heating a raw material comprising an aluminum nitride powder to 1500° C. at a pressure of at most 150 Pa, then increasing and holding the temperature at 1700 to 1900° C. in a pressurized atmosphere of at least 0.4 MPa using a non-oxidizing gas, and then cooling to 1600° C. at a cooling rate of at most 10° C/min, and wherein a grain boundary phase of the aluminum nitride substrate is a discontinuously dispersed non-dendritic grain boundary phase.

2. The aluminum nitride substrate for a circuit board according to claim 1, wherein the cumulative 10% grain size d10 is at least 0.6 μm, and the cumulative 50% grain size d50 is at most 1.6 μm, in the number-grain size distribution of the grain boundary phase as measured from a mirror-polished surface of the aluminum nitride substrate.

3. A method for producing the aluminum nitride substrate for a circuit board according to claim 1, comprising the steps of:
   heating a raw material comprising an aluminum nitride powder to 1500° C. at a pressure of at most 150 Pa;
   then increasing and holding the temperature at 1700 to 1900° C. in a pressurized atmosphere of at least 0.4 MPa using a non-oxidizing gas;
   then cooling to 1600° C. at a cooling rate of at most 10° C/min.

* * * * *